(12) United States Patent
Chen

(10) Patent No.: US 10,382,026 B1
(45) Date of Patent: Aug. 13, 2019

(54) PHASE SHIFT CONTROL CIRCUIT FOR MULTI-CHANNEL SYSTEM

(71) Applicant: ANPEC ELECTRONICS CORPORATION, Hsinchu (TW)

(72) Inventor: Fu-Chuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/161,942

(22) Filed: Oct. 16, 2018

(30) Foreign Application Priority Data

Jul. 20, 2018 (TW) .............................. 107125141 A

(51) Int. Cl.
*H03K 5/05* (2006.01)
*H03K 5/00* (2006.01)

(52) U.S. Cl.
CPC ..... *H03K 5/05* (2013.01); *H03K 2005/00286* (2013.01)

(58) Field of Classification Search
CPC .......... H03K 3/017; H03K 4/501; H03K 5/05; H03K 5/135; H03K 5/156; H03K 7/08; H03K 2005/00286
See application file for complete search history.

(56) References Cited

U.S. PATENT DOCUMENTS

| 6,331,802 B1 * | 12/2001 | Kim ........................ H03G 7/06 330/133 |
| 10,003,328 B1 * | 6/2018 | Yin ........................ H03K 5/156 |
| 2006/0075814 A1 * | 4/2006 | Ariyoshi ................. G01F 1/696 73/204.15 |
| 2008/0001661 A1 * | 1/2008 | Tachibana ............... H03F 3/347 330/253 |

\* cited by examiner

*Primary Examiner* — Janice N Tieu
(74) *Attorney, Agent, or Firm* — Li & Cai Intellectual Property (USA) Office

(57) ABSTRACT

A phase shift control circuit for a multi-channel system including a pulse control circuit and a current matching circuit is provided. The pulse control circuit includes first to third transistors, a front operational amplifier, comparers, a current mirror circuit, clock switch circuits and pulse generating circuits. The front operational amplifier has two input terminals connected to a voltage divider circuit and an output terminal of the first transistor respectively, and an output terminal connected to control terminals of all the transistors. One input terminal of the comparer is connected to an output terminal of the third transistor, and another input terminal of the comparer is connected to the output terminal of the first transistor or a reference voltage source. The pulse generators are connected to the comparers and the clock switch circuits respectively. The current mirror circuit is connected to the current matching circuit.

10 Claims, 8 Drawing Sheets

PHASE SHIFT CONTROL CIRCUIT FOR MULTI-CHANNEL SYSTEM

CROSS-REFERENCE TO RELATED PATENT APPLICATION

This application claims the benefit of priority to Taiwan Patent Application No. 107125141, filed on Jul. 20, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a phase shift control circuit, and more particularly to a phase shift control circuit for a multi-channel system.

BACKGROUND OF THE DISCLOSURE

A general electronic device such as a computer needs a power converter to supply power for operations of various electronic components in the electronic device. In general, the power converter is an important power source for the electronic device in addition to the built in battery in the electronic device. It is known that the power converter is properly designed based on a maximum power which may be consumed by the computer such that the power converter can provide the maximum power to ensure that the computer can operate normally under any circumstance.

However, as the central processing unit and the circuit elements of the computer operate more frequently, the power consumed by the operations increases. As a result, the power converter may need to supply very high power during the same time period, and the voltage provided by the power converter may be unstable voltage due to electromagnetic interference. In view of the problem, a large number of voltage stabilizing components such as capacitors need to be additionally disposed in the circuits resulting in an increase in a circuit layout cost.

SUMMARY OF THE DISCLOSURE

In response to the above-referenced technical inadequacies, the present disclosure provides a phase shift control circuit for a multi-channel system, which includes a pulse control circuit and a plurality of current matching circuits. The pulse control circuit includes a first voltage divider circuit, a plurality of transistors, a front operational amplifier, a plurality of comparators, a plurality of clock switch circuits, a plurality of pulse generating circuits and a current mirror circuit. The first voltage divider circuit is connected to an input voltage source. The plurality of transistors includes a first transistor, a second transistor and a plurality of third transistors. An input terminal of each of the transistors is connected to a common voltage source. An output terminal of the first transistor is grounded through a first feedback resistor. The front operational amplifier has two input terminals connected to the first voltage divider circuit and the output terminal of the first transistor respectively, and an output terminal connected to a control terminal of each of the transistors. One input terminal of each of the comparators is connected to an output terminal of one of the third transistors. Another input terminal of one of the comparators is connected to an output terminal of the first transistor. Another terminal of each of the other comparators is connected to one of a plurality of reference voltage sources. The clock switch circuits are connected to output terminals of the plurality of third transistors respectively. Input terminals of the plurality of pulse generating circuits are connected to output terminals of the plurality of comparators respectively. Each of the pulse generating circuits is configured to output a pulse signal for turning on or off the one or more clock switch circuits. The current mirror includes a first current mirror and a second current mirror. The first current mirror includes a fourth transistor and a fifth transistor. A control terminal of the fourth transistor is connected to a control terminal of the fifth transistor. An input terminal and a control terminal of the fourth transistor are connected to an output terminal of the second transistor. An output terminal of the fourth transistor and an output terminal of the fifth transistor are grounded. The second current mirror includes a sixth transistor and a seventh transistor. An output terminal and a control terminal of the sixth transistor are connected to an input terminal of the fifth transistor. The control terminal of the sixth transistor is connected to a control terminal of the seventh transistor. An input terminal of the sixth transistor and an input terminal of the seventh transistor are connected to the common voltage source. Each of the current matching circuits includes a second voltage divider circuit, a plurality of matching transistors, a matching operational amplifier and a phase shift circuit. The second voltage divider circuit is connected to a voltage signal source. The matching transistors include a first matching transistor, a second matching transistor and a third matching transistor. An input terminal of each of the matching transistors is connected to the common voltage source. An output terminal of the first matching transistor is grounded through a second feedback resistor and an output terminal of the second matching transistor is grounded through a third feedback resistor. The output terminal of the second matching transistor is connected to an output terminal of the seventh transistor. An output terminal of the third matching transistor is connected to the input terminal of the fifth transistor. The matching operational amplifier has one input terminal connected to the output terminal of the first matching transistor, and an output terminal connected to control terminals of the plurality of matching transistors. The phase shift circuit is connected between the second voltage divider circuit and another input terminal of the matching operational amplifier.

In addition, the present disclosure provides a phase shift control circuit for a multi-channel system, which includes a first pulse control circuit, one or more second pulse control circuits and a plurality of current matching circuits. The first pulse control circuit includes a first voltage divider circuit, a plurality of transistors, a front operational amplifier, a first clock switch circuit, a first comparator and a first pulse generating circuit. The first voltage divider circuit is connected to an input voltage source. The transistors include a first transistor and a second transistor. An output terminal of the first transistor is grounded through a first feedback resistor. An input terminal of the first transistor and an input terminal of the second transistor are connected to a common voltage source. The front operational amplifier has two input terminals connected to the first voltage divider circuit and an output terminal of the first transistor respectively, and an output terminal connected to a control terminal of each of the transistors. The first clock switch circuit is connected to an output terminal of the second transistor. The first comparator has two input terminals connected to an output terminal of the second transistor and the output terminal of the first transistor respectively. The first pulse generating circuit is connected to the output terminal of the first comparator. Each of the second pulse control circuits includes a second clock switch circuit, a second comparator, and a second pulse generating circuit. The second clock switch circuit is connected to the first clock generating circuit, and the second clock switch circuit of the other second pulse control circuit. The second comparator has two input terminals connected to the second clock switch circuit and a reference voltage source respectively. The second pulse generating circuit is connected to an output terminal of the second comparator. Each of the current matching circuits includes a second voltage divider circuit, a plurality of matching transistors, a matching operational amplifier and a phase shifting circuit. The second voltage divider circuit is connected to a voltage signal source. An input terminal of each of the matching transistors is connected to the common voltage source. The plurality of matching transistors includes a first matching transistor and a plurality of second matching transistors. An output terminal of the first matching transistor is grounded through a second feedback resistor. Output terminals of the plurality of second matching transistors of each of the current matching circuits are connected to the second clock switch circuits of the plurality of second pulse control circuits respectively. The matching operational amplifier has an input terminal connected to an output terminal of the first matching transistor, and an output terminal connected to control terminals of the plurality of matching transistors. The phase shifting circuit is connected between the second voltage divider circuit and another input terminal of the matching operational amplifier.

As described in above, the present disclosure provides the phase shift control circuit for the multi-channel system, which is capable of distributing circuit components such as a central processing unit of the electronic device to consume power in their operation processes during different time periods. That is, duty cycles of the voltage signal sources of the channels do not overlap with each other. Since the different power consumption time periods are properly distributed for the different circuit components of the electronic device, total power consumption of the electronic device during each of the time periods can be lower than a threshold value. In this way, it can avoid an unstable output voltage caused by excessive electromagnetic interference at each of time points so as to prolong a lifetime of the electronic device. Furthermore, a large number of capacitors do not need to be disposed for voltage stability such that a cost of the circuit layout is reduced and a space inside the electronic device is released. Accordingly, it is apparent that the present disclosure has significant advantages compared to the prior art.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
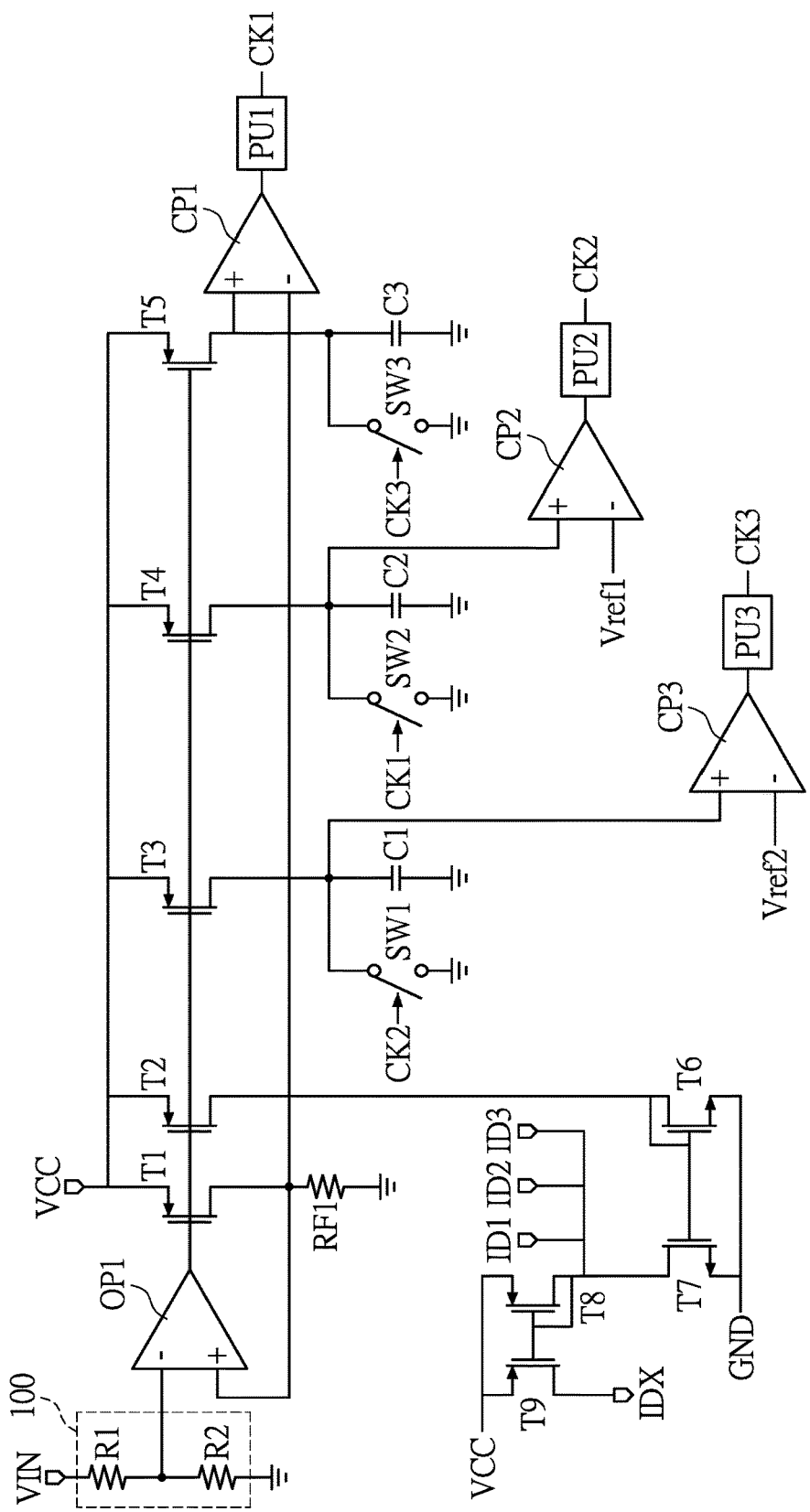
FIG. 1 is a circuit diagram of a pulse control circuit of a phase shift control circuit for a multi-channel system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a circuit diagram of a pulse control circuit of a phase shift control circuit for a multi-channel system according to a first embodiment of the present disclosure. The phase shift control circuit includes a pulse control circuit and a plurality of current matching circuits. As shown in FIG. 1, the pulse control circuit includes a voltage divider circuit 100, a front operational amplifier OP1, a plurality of transistors T1 to T9, a plurality of comparators CP1 to CP3, a plurality of clock switch circuits, a plurality of pulse generating circuits PU1 to PU3 and a current mirror circuit.

The voltage divider circuit 100 includes a resistor RV1 and a resistor RV2. One terminal of the resistor RV1 is connected to an input voltage source VIN, and another terminal of the resistor RV1 is connected to the resistor RV2 in series and grounded. An inverting input terminal of the front operational amplifier OP1 is connected between the resistor RV1 and the resistor RV2 and inputs an appropriate divided voltage to the front operational amplifier OP1 by adjusting resistances of the resistor RV1 and the resistor RV2.

The transistor T1 has a control terminal, a voltage input terminal and a voltage output terminal. For example, in the embodiment, when the transistor T1 is a p-channel enhancement mode MOSFET, those terminals are a gate terminal, a drain terminal and a source terminal respectively. The other transistors T2 to T5 are also p-channel enhancement mode MOSFETs as described below. However, the transistors T2 to T5 may be replaced with other types of transistors or other circuit elements with similar functions, and configurations between them and other elements may be adjusted correspondingly. A drain terminal of transistor T1 is connected to a non-inverting input terminal of the front operational amplifier OP1 and grounded through a feedback resistor RF1. A gate terminal of the transistor T1 is connected to an output terminal of the front operational amplifier OP1. A source terminal of the transistor T1 is connected to a common voltage source VCC.

As shown in FIG. 1, three similar circuit assemblies are disposed at a right side of the transistor T2. Each of the circuit assemblies includes a transistor, a clock switch circuit, a comparator and a pulse generating circuit. The number of the circuit assemblies may be determined depending on the number of power converter or buck-boost converter or other actual requirements, wherein a configuration between the power converter and the phase shift control circuit of the embodiment will be detailed below.

First, for a first circuit assembly, a gate terminal of the transistor T5 is connected to the output terminal of the front operational amplifier OP1. A source terminal of the transistor T5 is connected to the common voltage source VCC. A drain terminal of the transistor T5 is connected to a capacitor C3 and a clock switch SW3 of the clock switch circuit. The capacitor C3 and the clock switch SW3 are connected to each other in parallel and grounded. A non-inverting input terminal of the comparator CP1 is connected to the drain terminal of the transistor T5. An inverting input terminal of comparator CP1 is connected to the drain terminal of transistor T1. An output terminal of the comparator CP1 is connected to the pulse generating circuit PU1. The comparator CP1 is configured to trigger the pulse generating circuit PU1 to generate a pulse signal CK1.

For a second circuit assembly, a gate terminal of the transistor T4 is connected to the output terminal of the front operational amplifier OP1. A source terminal of the transistor T4 is connected to the common voltage source VCC. A drain terminal of the transistor T4 is connected to a capacitor C2 and a clock switch SW2 of the clock switch circuit. The capacitor C2 and the clock switch SW2 are connected to each other in parallel and grounded. A non-inverting input terminal of the comparator CP2 is connected to the drain terminal of the transistor T4 and a non-grounded terminal of the capacitor C2. An inverting input terminal of the comparator CP2 is connected to a reference voltage source Vref1. An output terminal of the comparator CP2 is connected to a pulse generating circuit PU2. The comparator CP2 is configured to trigger the pulse generating circuit PU2 to generate a pulse signal CK2 when a voltage of the capacitor C2 is charged to a voltage greater than the reference voltage source Vref1.

For a third circuit assembly, a gate terminal of the transistor T3 is connected to the output terminal of the front operational amplifier OP1. A source terminal of the transistor T3 is connected to the common voltage source VCC. A drain terminal of transistor T3 is connected to a capacitor C1 and a clock switch SW1 of the clock switch circuit. The capacitor C1 and the clock switch SW1 are connected to each other in parallel. A non-inverting input terminal of the comparator CP3 is connected to the drain terminal of transistor T3 and a non-ground terminal of capacitor C3. An inverting input terminal of comparator CP3 is connected to a reference voltage source Vref2. The reference voltage source Vref2 may have the same or different voltage value as the reference voltage source Vref1 described above. An output terminal of the comparator CP3 is connected to a pulse generating circuit PU3. The comparator CP2 is configured to trigger the pulse generating circuit PU3 to generate a pulse signal CK3 when a voltage of the capacitor C3 is charged to a voltage greater than the reference voltage source Vref2.

On the other hand, the current mirror circuit includes a first current mirror and a second current mirror. The first current mirror includes a transistor T6 and a transistor T7. For example, in the embodiment, the transistors T6 and T7 are n-channel enhancement mode MOSFETs. The second current mirror includes a transistor T8 and a transistor T9. For example, in the embodiment, the transistors T8 and T9 are p-channel enhancement mode MOSFETs. It should be understood that the present disclosure is not limited to the aforementioned types of the transistors. In practice, the different types and numbers of transistors may be selected according to actual requirements, and configurations between those transistors and other components may be adaptively adjusted.

A drain terminal and a gate terminal of the transistor T6 of the first current mirror are connected to a drain terminal of the transistor T2. The gate terminal of the transistor T6 is connected to a gate terminal of the transistor T7. A source terminal of transistor T6 and a source terminal of transistor T7 are grounded. A drain terminal of the transistor T7 is connected to a drain terminal and a gate terminal of the transistor T8 of the second current mirror. The gate terminal of the transistor T8 is connected to a gate terminal of the transistor T9. A source terminal of the transistor T8 and a source terminal of the transistor T9 are connected to the common voltage source VCC.

Figure 2:
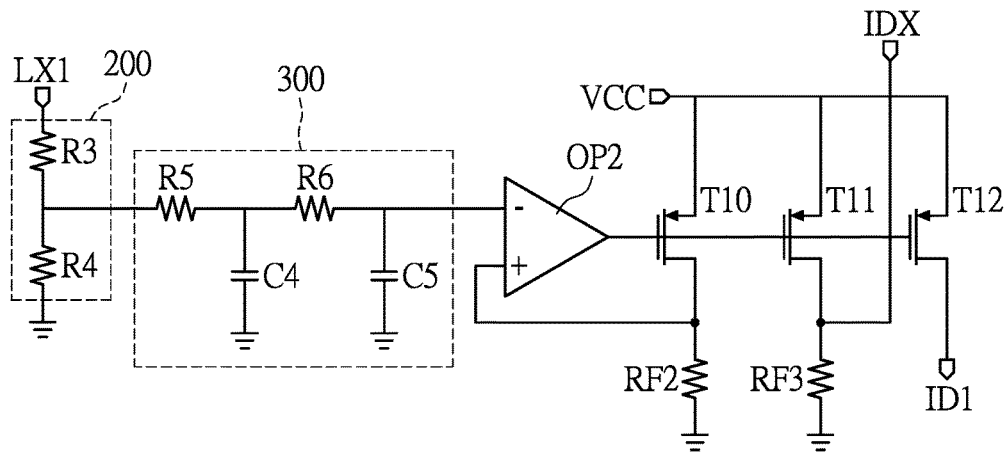
FIG. 2 is a circuit diagram of a current matching circuit of the phase shift control circuit for the multi-channel system according to the first embodiment of the present disclosure.

Further, reference is made to FIGS. 1 and 2, which are circuit diagrams of a pulse control circuit and a current matching circuit of a phase shift control circuit for a multichannel system according to a first embodiment of the present disclosure. The pulse control circuit shown in FIG. 1 is connected to the current matching circuit shown in FIG. 2 through a current mirror circuit as described below.

As shown in FIG. 2, the current matching circuit includes a voltage divider circuit 200, a phase shift circuit 300, an operational amplifier OP2, and a plurality of transistors T10 to T12. The voltage divider circuit 200 includes a resistor R3 and a resistor R4. One terminal of the resistor R3 is connected to a voltage signal source LX1, and another terminal of the resistor R3 is connected to the resistor R4 in series and grounded through the resistor R4.

For a source of the voltage signal source LX1, for example, the resistor R3 of the voltage divider circuit 200 is connected to an output terminal of a power convertor to receive the voltage signal source LX1 from the power convertor. More specifically, the power convertor includes an oscillation circuit, a control circuit, and two switch elements such as n-channel enhancement mode MOSFETs. As shown in FIG. 2, one terminal of the resistor R3 of the voltage divider circuit 200 may be connected to a node between the two switch elements of the power convertor. With the above configuration, the control circuit may output an oscillation signal to the switch elements from the oscillation circuit, and may supply an output voltage signal of the power convertor as the voltage signal source LX1 to the current matching circuit shown in FIG. 2 through the switching element.

The phase shift circuit 300 is connected between the voltage divider circuit 200 and the operational amplifier OP2. In detail, an input terminal of the phase shift circuit 300 is connected between the resistor R3 and the resistor R4 of the voltage divider circuit 200. An output terminal of the phase shift circuit 300 is connected to an inverting input terminal of the operational amplifier OP2. The phase shift circuit 300 includes a resistor R5, a resistor R6, a capacitor C4 and a capacitor C5. One terminal of the resistor R5 of the phase shift circuit 300 is connected between the resistor R3 and the resistor R4 of the voltage divider circuit 200. Another terminal of the resistor R5 is grounded through the capacitor C4. One terminal of the resistor R6 is connected between the resistor R5 and the capacitor C4. Another terminal of the resistor R6 is grounded through the capacitor C5.

The inverting input terminal of the operational amplifier OP2 is connected between the resistor R6 and the capacitor C5 of the phase shift circuit 300. A non-inverting input terminal of operational amplifier OP2 is connected to an output terminal of transistor T10. For example, in the embodiment, the transistors T10, T11, T12 are p-channel enhancement mode MOSFETs, each of which has a gate terminal, a drain terminal and a source terminal. An output terminal of the operational amplifier OP2 is connected to gate terminals of the transistors T10, T11, T12. Source terminals of the transistors T10, T11, T12 are connected to the common voltage source VCC. A drain terminal of the transistor T10 is grounded through a feedback resistor RF2 and a drain terminal of the transistor T11 is grounded through a feedback resistor RF3.

It should be noted that the drain terminal of the transistor T11 of the current matching circuit shown in FIG. 2 is connected to a drain terminal of the transistor T9 of the pulse control circuit shown in FIG. 1. With the configuration, an output current IDX may be supplied to the current matching circuit shown in FIG. 2 from the transistor T9 of the pulse control circuit shown in FIG. 1. In the embodiment, other current matching circuits have the same or similar circuit elements and layouts as that of the current matching circuit shown in FIG. 2. Therefore, one skilled in the art should understand the same operation of the other current matching circuits according to the descriptions herein related to the current matching circuit shown in FIG. 2.

The output current IDX of the pulse control circuit may be expressed by the following equation:

$$IDX=[VIN*K/RF1-(ID1+ID2+\ldots IDn)]/n,$$

wherein VIN represents the input voltage source, K=R2/(R1+R2), R1 and R2 represent the resistances of the resistors R1, R2 of the voltage divider circuit shown in FIG. 1, RF1 represents a resistance of the feedback resistor RF1 shown in FIG. 1, n represents the number of the current matching circuits, which have the same circuit layouts (or have different circuit layouts in practice) as shown in FIG. 2, ID1 to IDn represent n currents supplied to n pulse control circuits from n same current matching circuits as shown in FIG. 2 respectively. In the embodiment, three current matching circuits are configured to supply three currents such as the currents ID1, ID2, ID3 shown in FIG. 1 respectively, that is, n=3, but the present disclosure is not limited thereto. It should be noted that n depends on the number of the current matching circuits. If the number of the current matching circuits is increased or decreased, n is changed correspondingly.

Figure 3:
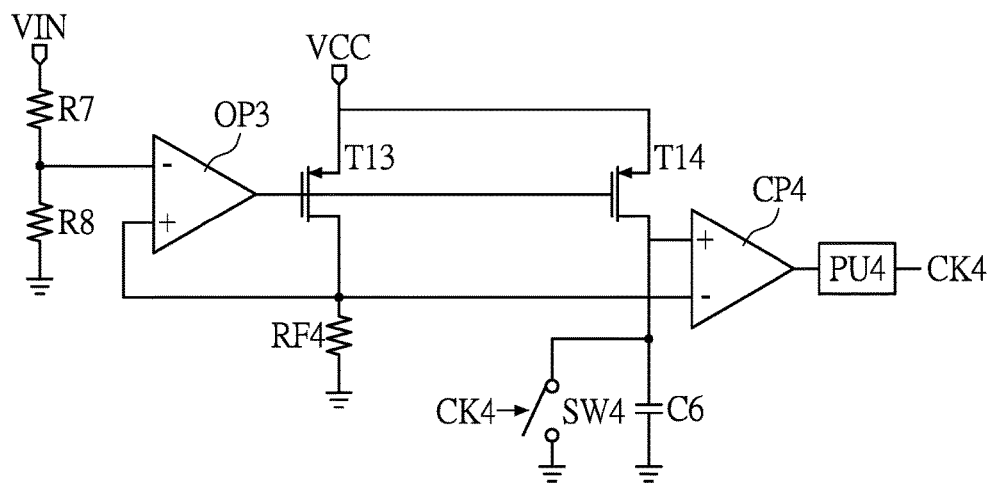
FIG. 3 is a circuit diagram of a first pulse control circuit of a phase shift control circuit for a multi-channel system according to a second embodiment of the present disclosure.

For convenience of description, the formulas are simplified in this embodiment as follows. In the embodiment, all the feedback resistors RF1 to RF4 shown in FIGS. 1 to 3 are assumed to have same resistances, which is expressed by the following equation: RF1=RF2=RF3=RF4. Further, a ratio of the resistors R1, R2 of the voltage divider circuit shown in FIG. 1, a ratio of the resistors R3, R4 of the voltage divider circuit shown in FIG. 2, and a ratio of the resistors R7, R8 of the voltage divider circuit shown in FIG. 3 are the same, which is expressed by the following equation: K=R2/(R1+R2)=R4/(R3+R4)=R8/(R7+R8). For example, the current ID1 shown in FIG. 1 is an output current of the current matching circuit shown in FIG. 2, which may be calculated by the following equation:

$$ID1=D1*VIN*K/RF2;$$

$$I=VIN*K/RF1,$$

wherein IDX represents an output current of the current mirror circuit of the pulse control circuit shown in FIG. 1, D1 represents a duty cycle of the voltage signal source LX1, and I represents a value of a current flowing through the resistor RF1.

$$Vref1=(D1*VIN*K/RF2+IDX)*RF3$$

$$=D1*VIN*K+[VIN*K/RF1-(ID1+ID2+ID3)]/3*RF3$$

$$=VIN*K*(D1+(1-D1-D2-D3)/3),$$

Figure 7:
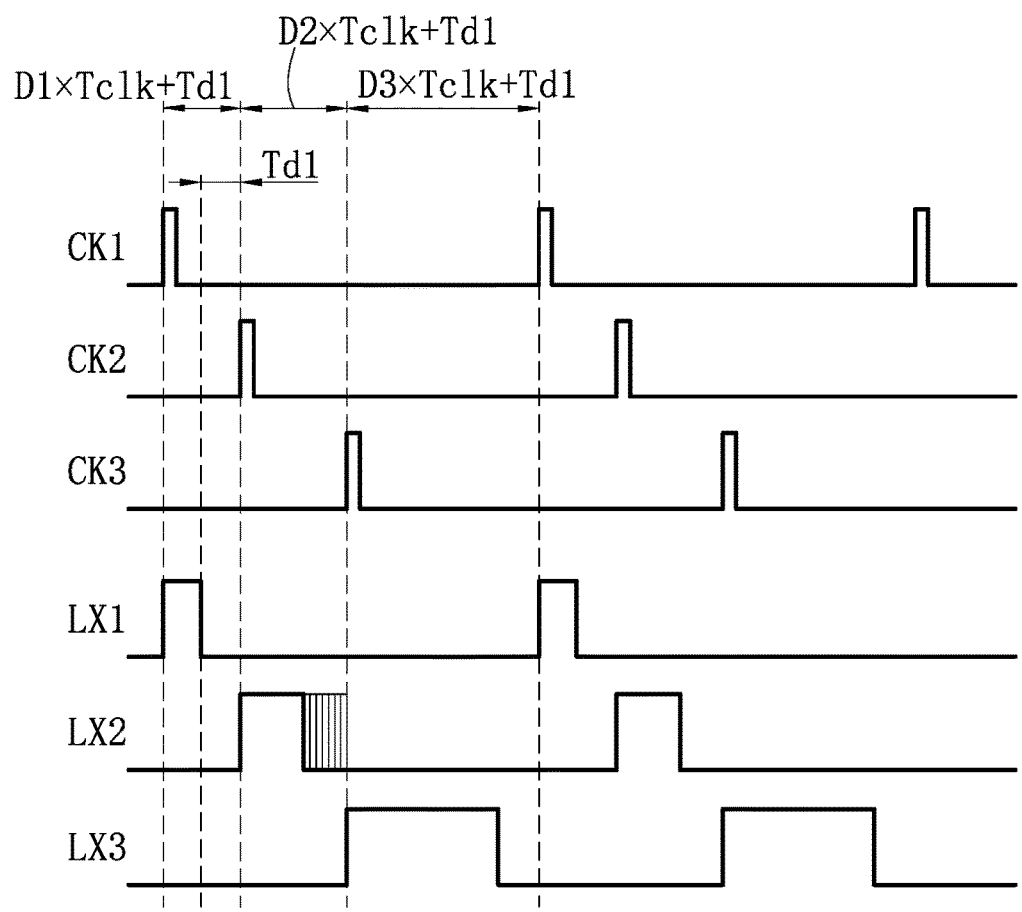
FIG. 7 is a waveform diagram of a pulse signal and a voltage signal source of the phase shift control circuit for the multi-channel system according to the first embodiment of the present disclosure.

Vref1 represents a voltage at the drain terminal of the transistor T11 shown in FIG. 2, which is equal to a voltage of the resistor RF3. D1 represents a duty cycle of the voltage signal source LX1 as shown in FIG. 7, D2 represents a duty cycle of the voltage signal source LX2 as shown in FIG. 7, and D3 represents a duty cycle of the voltage signal source LX3 as shown in FIG. 7. VIN represents a voltage of the input voltage source, R1 and R2 represent the resistances of the resistors R1, R2 shown in FIG. 1. RF1 represents the resistance of the feedback resistor RF1 shown in FIG. 1.

ID1, ID2, ID3 represent values of the currents supplied to the pulse control circuit from the three current matching circuits respectively. RF3 represents a resistance of the feedback resistor RF3 shown in FIG. 2.

Further, a drain terminal of the transistor T12 of the current matching circuit shown in FIG. 2 is connected to the drain terminal of the transistors T7, T8 of the pulse control circuit shown in FIG. 1. With the above circuit configuration, the pulse control circuit shown in FIG. 1 is combined with the current matching circuit shown in FIG. 2 to form the phase shift control circuit for the multi-channel system of the embodiment.

As shown in FIG. 1, the transistor T7 receives the three currents ID1, ID2 and ID3, which indicates that in the embodiment, the phase shift control circuit for the multi-channel system includes one pulse control circuit and three current matching circuits, but the present disclosure is not limited thereto. The phase shift control circuit receives the current ID1 from the transistor T12 of the current matching circuit shown in FIG. 2, and the other currents ID2, ID3 having the same or different current values as that of the current ID1 from other two current matching circuits (not shown). In the embodiment, the three current matching circuits have the same circuit layouts, and a difference between them is only in that they receive the different voltage signal sources LX1, LX2, LX3 from different circuit elements respectively.

The pulse generating circuit PU1 is configured to output the pulse signal CK1 for turning on or off the clock switch SW3 and the clock switch SW2, and the pulse generating circuit PU2 is configured to output the pulse signal CK2 for turning on or off the clock switch SW1. For example, when the pulse signal CK2 is a high level signal for turning on the clock switch SW1, the output current of the transistor T3 flows through the clock switch SW1 so that a voltage of the capacitor C1 at the non-inverting input terminal of the comparator CP3 is smaller than reference voltage source Vref2, and thus the pulse generating circuit PU3 is not triggered. Conversely, when the pulse signal CK2 is a low level signal for turning off the clock switch SW1, the output current of the transistor T3 flows through the capacitor C1 to continuously charge the capacitor C1. When the voltage of the capacitor C1 is larger than the reference voltage source Vref2, the pulse generating circuit PU3 is triggered to generate the pulse signal CK3 by the comparator CP3.

Reference is made to FIGS. 1, 2 and 7, wherein FIG. 7 is a waveform diagram of a pulse signal and a voltage signal source of the phase shift control circuit for the multi-channel system according to the first embodiment of the present disclosure. With the circuit layouts shown in FIGS. 1 and 2, in FIG. 7, the duty cycles of the voltage signal sources LX1, LX2, LX3 respectively outputted by three circuit components such as the power converters may be distributed based on the three pulse signals CK1, CK2, CK3. Therefore, waveforms of the voltage signal sources LX1, LX2, LX3 (including a static portion and a dynamic adjustment portion) are staggered without overlapping. The dynamic adjustment portion is marked by a plurality of straight lines on a right side of a first pulse of the voltage signal source LX2 as shown in FIG. 7.

As shown in FIG. 7, in the embodiment, delay times are averagely distributed based on the duty cycles of the voltage signal sources LX1, LX2, LX3 of the channels. The duty cycles of the voltage signal sources LX1, LX2, LX3 of the channels are subtracted from a time between a rising edge of a pulse and a rising edge of a next pulse of the pulse signal CK1, CK2 or CK3, and a remaining time is divided by the number of channels to obtain an average time as the delay time between the voltage signal sources LX1, LX2, LX3 of the channels. The delay time may be calculated from the following equation:

$$Td1=(1-D1-D2-D3)/3*Tclk,$$

wherein Td1 represents the delay time between a falling edge of a waveform of a voltage signal source and a rising edge of a waveform of a next voltage signal source. For example, Td1 is the delay time between a falling edge of a first waveform of the voltage signal source LX1 and a rising edge of a first waveform of the voltage signal source LX2, or the delay time between a falling edge of the first waveform of the voltage signal source LX2 and a rising edge of a first waveform of the voltage signal source LX3. D1 represents a ratio of the duty cycle to a full cycle (a sum of the duty cycle and a non-duty cycle) of the voltage signal source LX1. D2 represents a ratio of the duty cycle to a full cycle of the voltage signal source LX2. D3 represents a ratio of the duty cycle to a full cycle of the voltage signal source LX3. Tclk represents a total distributed time, that is, the time between (rising edges of) two waveforms of the clock signal CK1, CK2 or CK3.

The total distributed time Tclk may be expressed by the following equation:

$$Tclk=RF1*C,$$

wherein RF1 represents a resistance of the feedback resistor RF1 shown in FIG. 1, C represents a capacitance of the capacitor C1, C2 or C3 shown in FIG. 1, where the capacitors C1, C2, C3 may have the same or different capacitances.

As mentioned above, the same delay time is distributed for each of the channels. The voltage signal sources LX1, LX2, LX3 have different duty cycles, so that a phase shift time T1, T2 or T3 that is a sum of the duty cycle and the delay time of each of the voltage signal sources LX1, LX2, LX3 is different from that of other voltage signal sources LX1, LX2, LX3. As shown in FIG. 7, the times T1, T2, T3 may be expressed by the following equations:

$$T1=D1*Tclk+Td1;$$

$$T2=D2*Tclk+Td1;$$

$$T3=D3*Tclk+Td1,$$

wherein T1 is a sum of the duty cycle and the delay time of the voltage signal source LX1, T2 is a sum of the duty cycle and the delay time of the voltage signal source LX2, T3 is a sum of the duty cycle and the delay time of the voltage signal source LX3. D1, D2, D3 represent the duty cycles of the voltage signal sources LX1, LX2, LX3 respectively. Tclk=RF1*C. Td1 represents the delay time.

That is, a phase shift time depends on the duty cycles of the voltage signal sources LX1, LX2, LX3 of the channels, which is expressed by the following equation:

$$Tphase=Dn*Tclk+(1-(D1+Dn))*Tclk,$$

wherein Tphase represents the phase shift time, D1 represents a duty cycle of a first voltage signal source, and Dn represents a duty cycle of a nth voltage signal source.

Second Embodiment

Reference is made to FIG. 3, which is a circuit diagram of a first pulse control circuit of a phase shift control circuit for a multi-channel system according to a second embodiment of the present disclosure. As shown in FIG. 3, the pulse control circuit includes a voltage divider circuit, a front operational amplifier OP3, a plurality of transistors T13, T14, a clock switch circuit, a comparator CP4 and a clock generating circuit PU4.

The voltage divider circuit includes a resistor R7 and a resistor R8. One terminal of the resistor R7 is connected to the input voltage source VIN, and another terminal of the resistor R7 is connected to the resistor R8 in series and grounded. An inverting terminal of the front operational amplifier OP3 is connected between the resistor R7 and the resistor R8. A non-inverting terminal of the front operational amplifier OP3 is connected to a drain terminal, namely, a voltage output terminal, of the transistor T13.

An output terminal of the front operational amplifier OP3 is connected to gate terminals of the transistors T13, T14. Source terminals of the transistors T13, T14 are connected to the common voltage source VCC. The drain terminal of the transistor T13 is grounded through a feedback resistor RF4. A drain terminal of the transistor T14 is connected to one terminal of a clock switch SW4 and one terminal of a capacitor C6 of the clock switch circuit. The clock switch SW4 and the capacitor C6 are connected to each other in parallel. Another terminal of the clock switch SW4 and another terminal of the capacitor C6 are grounded.

An inverting input terminal of the comparator CP4 is connected to the drain terminal of the transistor T14 and a non-grounded terminal of the capacitor C6. A non-inverting input terminal of the comparator CP4 is connected to the drain terminal of the transistor T13. An output terminal of the comparator CP4 is connected to an input terminal of the clock generating circuit PU4 and configured to trigger the clock generating circuit PU4 to generate a pulse signal CK4.

Figure 4:
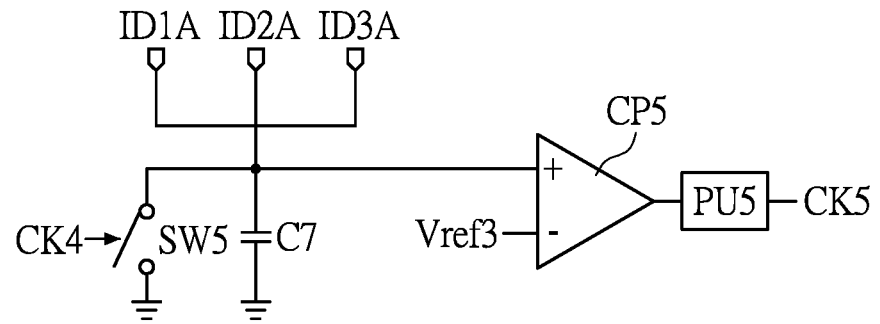
FIG. 4 is a circuit diagram of a second pulse control circuit of the phase shift control circuit for the multi-channel system according to the second embodiment of the present disclosure.
Figure 5:
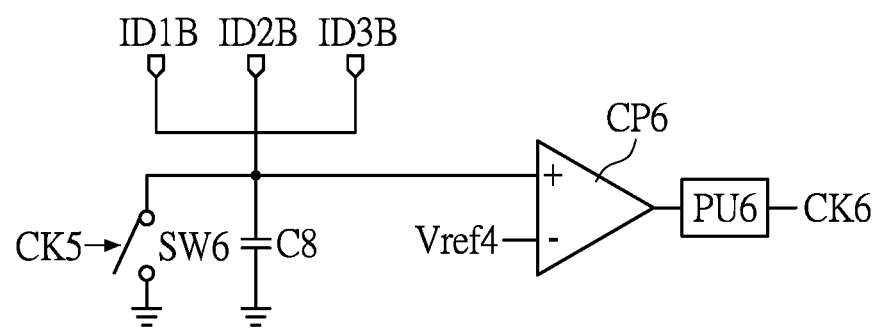
FIG. 5 is a circuit diagram of a second pulse control circuit of the phase shift control circuit for the multi-channel system according to the second embodiment of the present disclosure.

Reference is made to FIGS. 4 and 5, which are circuit diagrams of two second pulse control circuits of the phase shift control circuit for the multi-channel system according to the second embodiment of the present disclosure. The two similar pulse control circuits are shown in FIGS. 4 and 5 respectively, but the number of which may be expanded or reduced according to actual requirements, the present disclosure is not limited thereto.

As shown in FIG. 4, an inverting input terminal of the comparator CP5 is connected to a clock switch SW5 and a capacitor C7 of the clock switch circuit. The clock switch SW5 and the capacitor C7 are connected to each other in parallel. The capacitor C7 is connected to current sources ID1A, ID2A, ID3A. When the clock switch SW5 is turned off to form an open circuit, the capacitor C7 is charged by the current sources ID1A, ID2A, ID3A. A non-inverting input terminal of comparator CP5 is connected to a reference voltage source Vref3. An output terminal of the comparator CP5 is connected to the clock generating circuit PU5. When a voltage of the capacitor C7 is larger than a voltage of the reference voltage source Vref3, the pulse generating circuit PU5 is triggered to generate a pulse signal CK5 by the comparator CP5.

Similarly, as shown in FIG. 5, an inverting input terminal of the comparator CP6 is connected to a clock switch SW6 and a capacitor C8 of the clock switch circuit. The clock switch SW6 and the capacitor C8 are connected to each other in parallel. The capacitor C8 is connected to current sources ID1B, ID2B, ID3B. When the clock switch SW6 is turned off to form an open circuit, the capacitor C8 is charged by the current sources ID1B, ID2B, ID3B. A non-inverting input terminal of comparator CP6 is connected to a reference voltage source Vref4. An output terminal of the comparator CP6 is connected to the clock generating circuit PU6. When a voltage of the capacitor C8 is larger than a voltage of the reference voltage source Vref4, the pulse generating circuit PU6 is triggered to generate a pulse signal CK6 by the comparator CP6. The circuit components shown in FIG. 5 may be the same as or different from the circuit components shown in FIG. 4, for example, the capacitor C8 and the capacitor C7 may have the same capacitance.

Figure 6A:
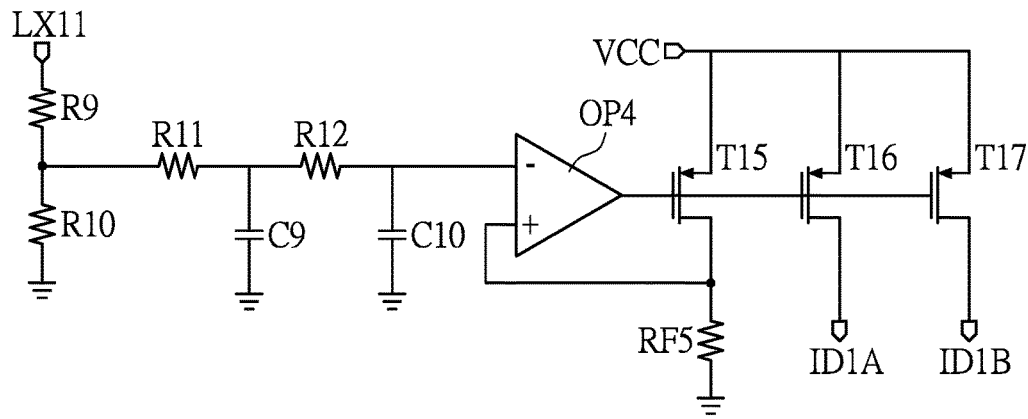
FIGS. 6A to 6C are circuit diagrams of current matching circuits of the phase shift control circuit for the multi-channel system according to the second embodiment of the present disclosure.
Figure 6B:
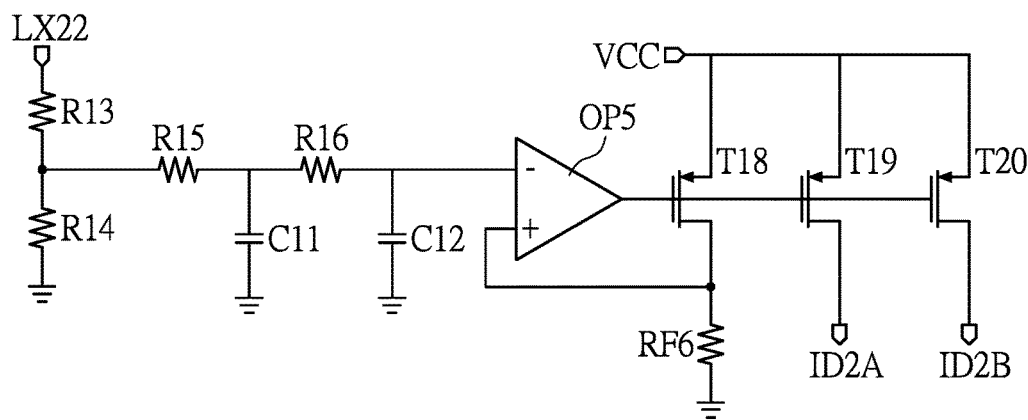
Figure 6C:
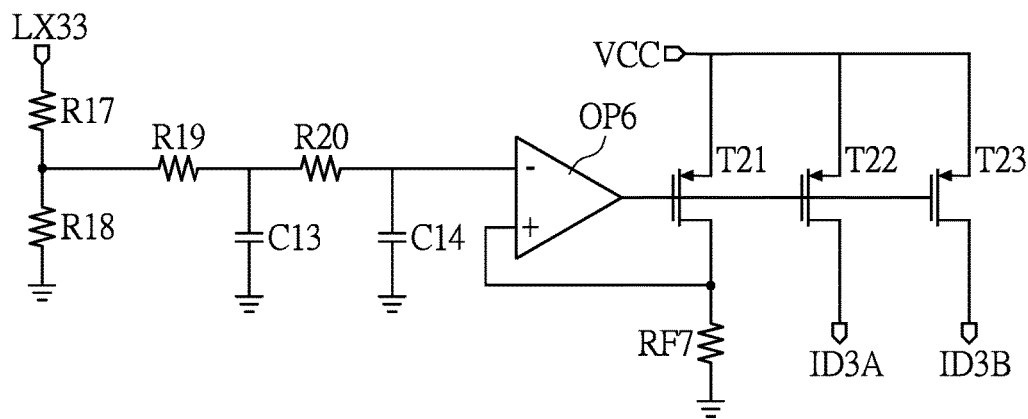

Further, reference is made to FIG. 6A to 6C, which are circuit diagrams of current matching circuits of the phase shift control circuit for the multi-channel system according to the second embodiment of the present disclosure. The current sources ID1A, ID1B shown in FIGS. 4 and 5 may be output currents of the current matching circuit shown in FIG. 6A. The current sources ID2A, ID2B shown in FIGS. 4 and 5 may be output currents of the current matching circuit shown in FIG. 6B. The current sources ID3A, ID3B shown in FIGS. 4 and 5 may be output currents of the current matching circuit shown in FIG. 6C. The number of the current matching circuits as shown in FIGS. 6A to 6C may depend on the number of the second pulse control circuits as shown in FIGS. 3 to 5. For example, in the embodiment, the three current matching circuits are configured, but the present disclosure is not limited thereto.

As shown in FIG. 6A, the current matching circuit may include a voltage divider circuit, a phase shift circuit, a matching operational amplifier OP4, and a plurality of transistors T15, T16, T17. The voltage divider circuit includes a resistor R9 and a resistor R10 which are connected to each other in series and grounded. One terminal of the resistor R9 is connected to a voltage signal source LX11, and another terminal of the resistor R9 is connected to the resistor R10 in series and grounded through the resistor R10. The phase shift circuit includes a resistor R11, a resistor R12, a capacitor C9 and a capacitor C10. One terminal of the resistor R11 is connected between the resistor R9 and the resistor R10 of the voltage divider circuit, and another terminal of the resistor R11 is grounded through the capacitor C9. One terminal of the resistor R12 is connected between the resistor R11 and the capacitor C9, and another terminal of the resistor R12 is grounded through the capacitor C10.

An inverting input terminal of the matching operational amplifier OP4 is connected between the resistor R12 and the capacitor C10 of the phase shift circuit. A non-inverting input terminal of the matching operational amplifier OP4 is connected to a drain terminal of the transistor T15. An output terminal of the matching operational amplifier OP4 is connected to gate terminals of the transistors T15, T16, T17. Source terminals of the transistors T15, T16, T17 are connected to the common voltage source VCC. The drain terminal of the transistor T15 is grounded through the feedback resistor RF5. It is worth noting that a drain terminal of the transistor T16 is connected to a non-ground terminal of the capacitor C7 of the pulse control circuit shown in FIG. 4. A drain terminal of the transistor T17 is connected to a non-ground terminal of the capacitor C8 of the pulse control circuit shown in FIG. 5 so as to supply the voltage signal sources ID1A, ID1B shown in FIG. 6 to the pulse control circuits as shown in FIGS. 4 and 5 respectively.

Similarly, as shown in FIG. 6B, the voltage divider circuit includes a resistor R13 and a resistor R14 which are connected to each other in series and grounded. The resistor R13 is connected to the voltage signal source LX22. One terminal of the resistor R15 of the phase shift circuit is connected between the resistor R13 and the resistor R14 of the voltage divider circuit, and another terminal of the resistor R15 is grounded through the capacitor C11. One terminal of the resistor R16 is connected between the resistor R15 and the capacitor C11, and another terminal of the resistor R16 is grounded through the capacitor C12.

An inverting input terminal of the matching operational amplifier OP5 is connected between the resistor R16 and the capacitor C12. A non-inverting input terminal of the matching operational amplifier OP5 is connected to a drain terminal of the transistor T18. An output terminal of the matching operational amplifier OP5 is connected to gate terminals of the transistors T18, T19, T20. Source terminals of the transistors T18, T19, T20 are connected to the common voltage source VCC. The drain terminal of the transistor T18 is grounded through the feedback resistor RF6. It is worth noting that a drain terminal of the transistor T19 is connected to a non-ground terminal of the capacitor C7 shown in FIG. 4. A drain terminal of the transistor T20 is connected to a non-ground terminal of the capacitor C8 shown in FIG. 5 so as to supply the voltage signal sources ID2A, ID2B to the pulse control circuits as shown in FIGS. 4 and 5 respectively.

Similarly, as shown in FIG. 6C, the voltage divider circuit includes a resistor R17 and a resistor R18 which are connected to each other in series and grounded. The resistor R17 is connected to the voltage source LX33. One terminal of the resistor R19 of the phase shift circuit is connected between the resistor R17 and the resistor R18, and another terminal of the resistor R19 is grounded through the capacitor C13. One terminal of the resistor R20 is connected between the resistor R19 and the capacitor C20, and another terminal of the resistor R20 is grounded through the capacitor C14.

An inverting input terminal of the matching operational amplifier OP6 is connected between the resistor R11 and the capacitor C14. A non-inverting input terminal of the matching operational amplifier OP6 is connected to a drain terminal of the transistor T21. An output terminal of the matching operational amplifier OP6 is connected to gate terminals of the transistors T21, T22, T23. Source terminals of the transistors T21, T22, T23 are connected to the common voltage source VCC. The drain terminal of the transistor T21 is grounded through the feedback resistor RF7. It is worth noting that a drain terminal of the transistor T22 is connected to a non-ground terminal of the capacitor C7 shown in FIG. 4. A drain terminal of the transistor T23 is connected to a non-ground terminal of the capacitor C8 shown in FIG. 5 so as to supply the voltage signal sources ID3A, ID3B to the pulse control circuits as shown in FIGS. 4 and 5 respectively.

Figure 8:
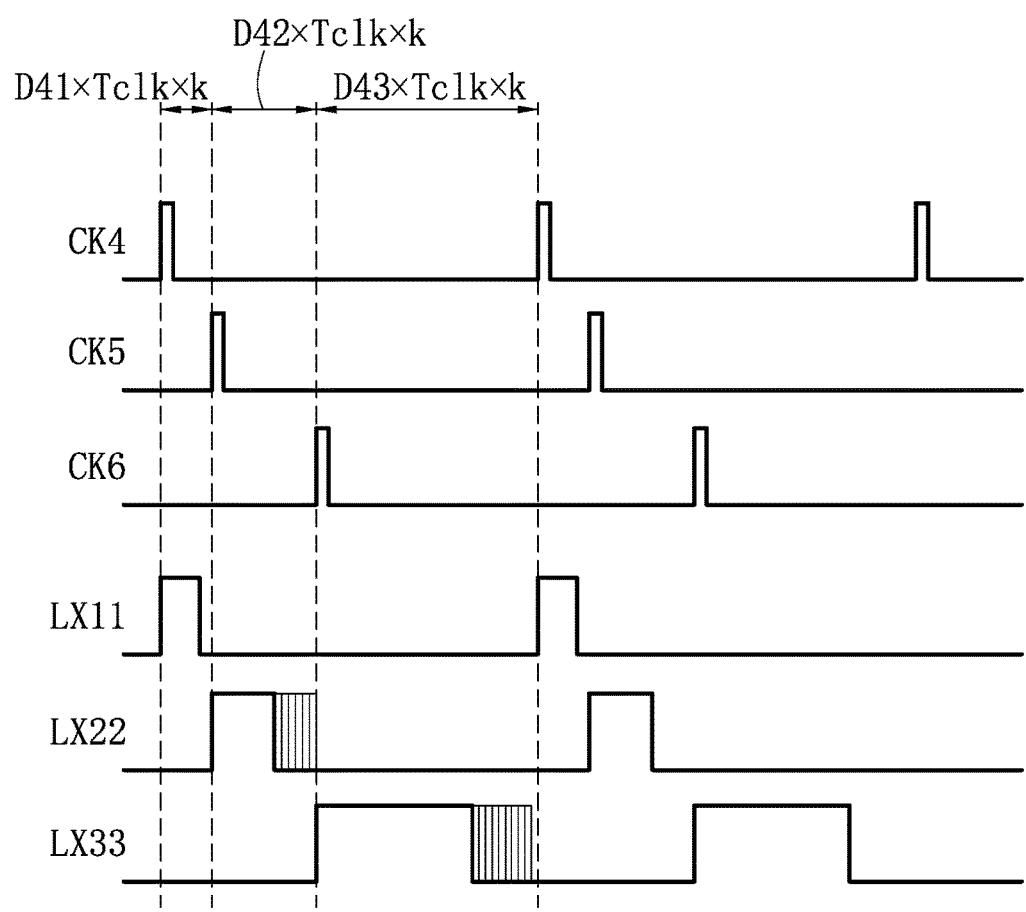
FIG. 8 is a waveform diagram of pulse signals and voltage signal sources of the phase shift control circuit for the multi-channel system according to the second embodiment of the present disclosure.

Reference made is FIG. 8, which is a waveform diagram of pulse signals and voltage signal sources of the phase shift control circuit for the multi-channel system according to the second embodiment of the present disclosure. The duty cycles of the voltage signal sources LX11, LX22, LX33 respectively supplied to the circuit elements from the power convertor may be distributed by the circuit layouts shown in FIGS. 3 to 6C. As shown in FIG. 8, the duty cycles of the voltage signal sources LX11, LX22, LX33 do not overlap with each other. That is, various circuit components such as a central processing unit of the same electronic device consume electric power supplied from the power convertor during different time periods respectively.

A time between a rising edge of a pulse and a rising edge of a next pulse of the pulse signal CK4 is represented by the total distributed time Tclk, which may be calculated by the following equation:

$$Tclk = RF4 \cdot C6,$$

wherein RF4 represents a resistance of the resistor RF4 shown in FIG. 3, and C6 represents a capacitance of the capacitor C6 shown in FIG. 3.

In comparison to the delay times averagely distributed in the first embodiment as shown in FIG. 7, a distribution ratio of the delay times depends on a ratio of the duty cycles of the voltage signal sources LX11, LX22, LX33 in the embodiment as shown in FIG. 8. As shown in FIG. 8, dynamic adjustment times of the voltage signal sources LX22, LX33 are reserved. As a result, the power consumption times may be more effectively distributed compared with the first embodiment as shown in FIG. 7.

As shown in FIG. 8, sums of the duty cycles and delay times of the voltage signal sources LX11, LX22, LX33 are times T11, T22, T33 respectively, which are expressed by the following equations:

$$T11 = D41 \cdot Tclk \cdot k;$$

$$T22 = D42 \cdot Tclk \cdot k;$$

$$T33 = D43 \cdot Tclk \cdot k,$$

wherein D41, D42, D43 represent the duty cycles of the voltage signal sources LX11, LX22, LX33 respectively, and a coefficient $k = 1/(D41+D42+D43)$.

In the embodiment, phase shifts of waveforms of the voltage signal sources LX11, LX22, LX33 depend on voltage conversion ratios of the voltage signal sources LX11, LX22, LX33 of the channels, where the voltage conversion ratio is a ratio of the duty cycle to the full cycle. The voltage conversion ratios of the voltage signal sources LX11, LX22, LX33 are proportional to the phase shift times, which is expressed by the following equation:

$$Tphase = Dn \cdot Tclk / (D1 + \ldots Dn),$$

wherein Tphase represents the phase shift time, D1 represents the voltage conversion ratio of a first voltage signal source, and Dn represents the voltage conversion ratio of a nth voltage signal source.

Figure 9:
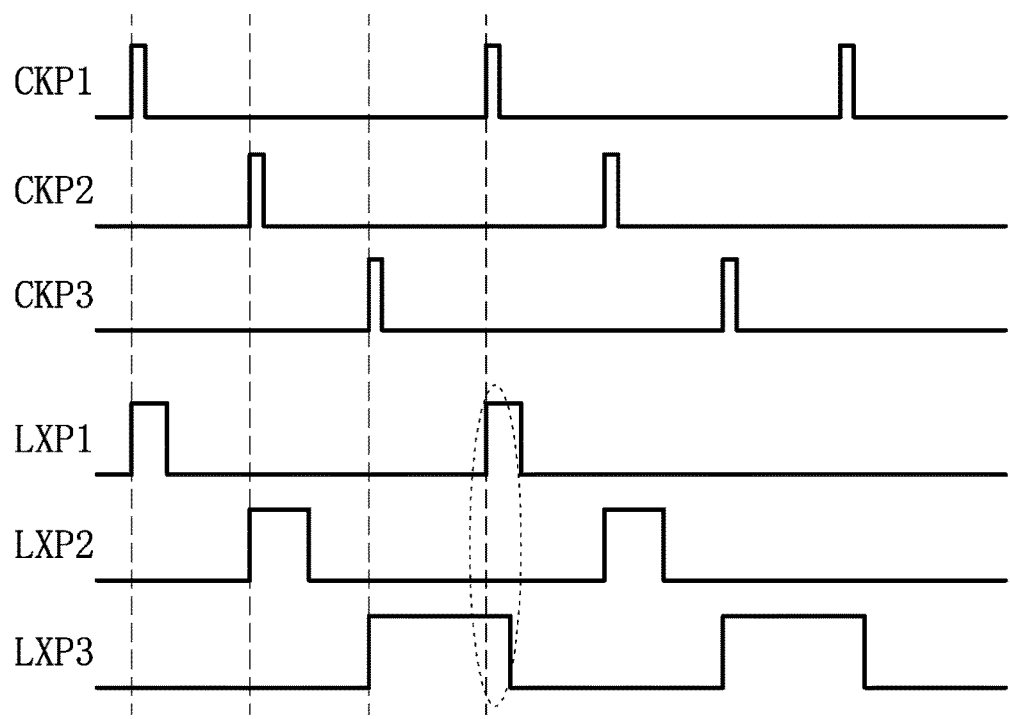
FIG. 9 is a waveform diagram of pulse signals and voltage signal sources of a transitional phase shift control circuit for a multi-channel system.
Figure 10:
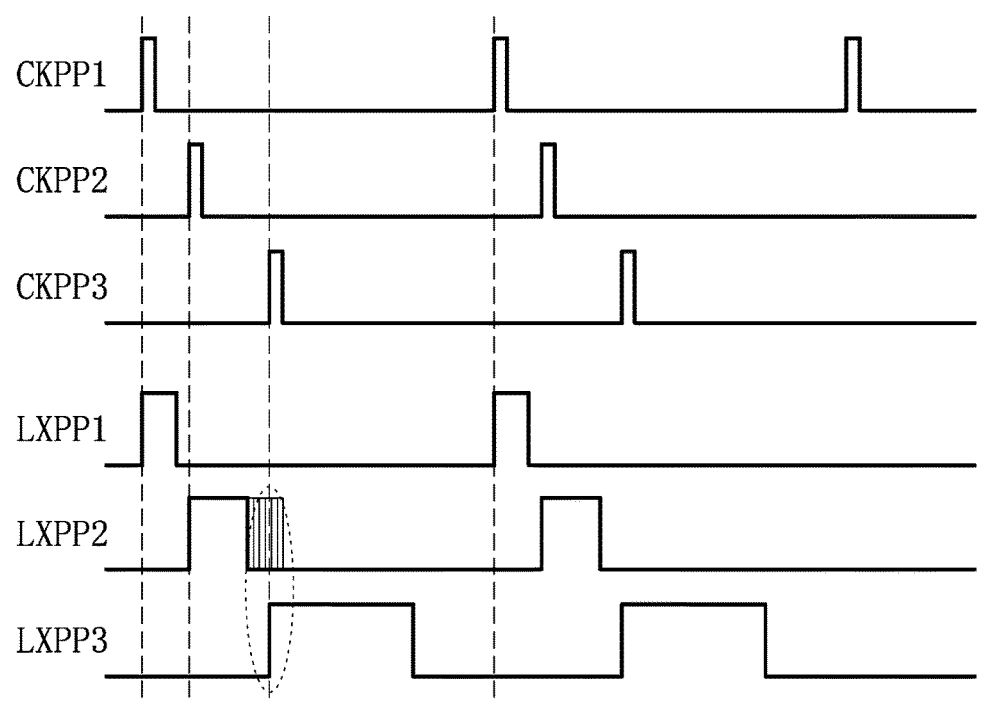
FIG. 10 is a waveform diagram of pulse signals and voltage signal sources of a transitional phase shift control circuit for a multi-channel system.

It is worth noting that, as shown in FIG. 9, the conventional phase shift control circuit for the multi-channel system has a fixed phase shift time, so that the waveforms of the voltage signal sources of some channels such as the voltage signal sources LXP1, LXP3 overlap with each other since each of the duty cycles of those voltage signal sources is larger than the fixed phase shift time. Alternatively, as shown in FIG. 10, the conventional phase shift control circuit for the multi-channel system performs phase shift calculation only based on the duty cycles. However, in practical applications, switching times of the switch elements of the power convertor such as n-channel enhancement mode MOSFETs may vary with a load. As a result, as shown in FIG. 10, the waveforms of the voltage signal sources LXPP2, LXPP3 overlap with each other. If more channels are used at the same time, the more waveforms of channels may overlap with each other. That is, the circuit components of the same electronic device may consume a large amount of total power at a time point. As a result, a life time of the electronic device is reduced. In order to avoid unstable output voltage due to excessive electromagnetic interference, a large number of capacitors need to be disposed and a cost of the circuit layout is increased.

In contrast, the phase shift control circuit for the multi-channel system of the first and second embodiments of the present disclosure is capable of distributing different circuit components of the electronic device to consume power during different time periods, such that the power consumption of the electronic device in each time period is lower than a threshold. Therefore, the voltage can be maintained stable and the lifetime of the electronic device can be prolonged without increasing the cost. Accordingly, it is apparent that the present disclosure has significant advantages compared to the prior art.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A phase shift control circuit for a multi-channel system, comprising:
    a pulse control circuit including:
        a first voltage divider circuit connected to an input voltage source;
        a plurality of transistors including a first transistor, a second transistor and a plurality of third transistors, wherein an input terminal of each of the transistors is connected to a common voltage source, and an output terminal of the first transistor is grounded through a first feedback resistor;
        a front operational amplifier having two input terminals connected to the first voltage divider circuit and the output terminal of the first transistor respectively, and an output terminal connected to a control terminal of each of the transistors;
        a plurality of comparators, wherein one input terminal of each of the comparators is connected to an output terminal of one of the third transistors, another input terminal of one of the comparators is connected to the output terminal of the first transistor, and another input terminal of each of the other comparators is connected to one of a plurality of reference voltage sources;
        a plurality of clock switch circuits connected to output terminals of the plurality of third transistors respectively; and
        a plurality of pulse generating circuits, wherein input terminals of which are connected to output terminals of the plurality of comparators respectively, and each of the pulse generating circuits is configured to output a pulse signal for turning on or off the one or more clock switch circuits;
    a current mirror circuit including:
        a first current mirror including a fourth transistor and a fifth transistor, wherein a control terminal of the fourth transistor is connected to a control terminal of the fifth transistor, an input terminal and a control terminal of the fourth transistor are connected to an output terminal of the second transistor, and an output terminal of the fourth transistor and an output terminal of the fifth transistor are grounded; and
        a second current mirror including a sixth transistor and a seventh transistor, wherein an output terminal and a control terminal of the sixth transistor are connected to an input terminal of the fifth transistor, the control terminal of the sixth transistor is connected to a control terminal of the seventh transistor, and an input terminal of the sixth transistor and an input terminal of the seventh transistor are connected to the common voltage source; and
    a plurality of current matching circuits each including:
        a second voltage divider circuit connected to a voltage signal source;
        a plurality of matching transistors including a first matching transistor, a second matching transistor and a third matching transistor, an input terminal of each of the matching transistors is connected to the common voltage source, an output terminal of the first matching transistor is grounded through a second feedback resistor and an output terminal of the second matching transistor is grounded through a third feedback resistor, the output terminal of the second matching transistor is connected to an output terminal of the seventh transistor, an output terminal of the third matching transistor is connected to the input terminal of the fifth transistor;
        a matching operational amplifier having one input terminal connected to the output terminal of the first matching transistor, and an output terminal connected to control terminals of the plurality of matching transistors; and
        a phase shift circuit connected between the second voltage divider circuit and another input terminal of the matching operational amplifier.

2. The phase shift control circuit of claim 1, wherein the plurality of clock switch circuits including:
    a first clock switch circuit including a first capacitor and a first clock switch which are connected to each other in parallel and grounded, wherein the first capacitor and the first clock switch are connected to the output terminal of one of the third transistors, and two input terminals of one of the comparators are connected to the output terminal of the first transistor and a non-grounded terminal of the first capacitor respectively;
    a second clock switch circuit including a second capacitor and a second clock switch which are connected to each other in parallel and grounded, wherein the second capacitor and the second clock switch are connected to an output terminal of another third transistor among the third transistors, and two input terminals of another comparator among the comparators are connected to a non-grounded terminal of the second capacitor and the reference voltage source respectively; and
    a third clock switch circuit including a third capacitor and a third clock switch which are connected to each other in parallel and grounded, wherein the third capacitor and the third clock switch are connected to an output terminal of yet another third transistor among the third transistors, and two input terminals of yet another comparator among the comparators are connected to a non-grounded terminal of the third capacitor and the reference voltage source respectively;
    wherein the first clock switch circuit outputs the first pulse signal for turning on or off the first clock switch circuit and the second clock switch circuit, and the second clock switch circuit outputs the second pulse signal for turning on or off the third clock switch circuit.

3. The phase shift control circuit of claim 1, wherein the first voltage divider circuit includes a first resistor an a second resistor which are connected to each other in series and grounded, the first resistor is connected to the input voltage source, the input terminal of the front operational amplifier connected to the first voltage divider circuit is connected between the first resistor and the second resistor.

4. The phase shift control circuit of claim 1, wherein the second voltage divider circuit includes a third resistor an a fourth resistor which are connected to each other in series and grounded, the third resistor is connected to the voltage signal source, an input terminal of the phase shift circuit is connected between the third resistor and the fourth resistor.

5. The phase shift control circuit of claim 4, wherein the phase shift circuit includes a first phase shift resistor, a second shift resistor, a first phase shift capacitor and a second shift capacitor, one terminal of the first phase shift resistor is connected between the third resistor and the fourth resistor, and another terminal of the first phase shift resistor is grounded through the first phase shift capacitor, one terminal of the second phase shift resistor is connected between the first phase shift resistor and the first phase shift capacitor, and another terminal of the second phase shift resistor is grounded through the second phase shift capacitor, the another input terminal of the matching operational amplifier is connected between the second phase shift resistor and the second phase shift capacitor.

6. A phase shift control circuit for a multi-channel system, comprising:
   a first pulse control circuit including:
      a first voltage divider circuit connected to an input voltage source;
      a plurality of transistors including a first transistor and a second transistor, wherein an output terminal of the first transistor is grounded through a first feedback resistor, and an input terminal of the first transistor and an input terminal of the second transistor are connected to a common voltage source;
      a front operational amplifier having two input terminals connected to the first voltage divider circuit and the output terminal of the first transistor respectively, and an output terminal connected to a control terminal of each of the transistors;
      a first clock switch circuit connected to an output terminal of the second transistor;
      a first comparator having two input terminals connected to the output terminal of the second transistor and the output terminal of the first transistor respectively; and
      a first pulse generating circuit connected to the output terminal of the first comparator;
   one or more second pulse control circuits each including:
      a second clock switch circuit connected to the first clock generating circuit, and the second clock switch circuit of the other second pulse control circuit;
      a second comparator having two input terminals connected to the second clock switch circuit and a reference voltage source respectively; and
      a second pulse generating circuit connected to an output terminal of the second comparator; and
   a plurality of current matching circuits each including:
      a second voltage divider circuit connected to a voltage signal source;
      a plurality of matching transistors, wherein an input terminal of each of the matching transistors is connected to the common voltage source, and the plurality of matching transistors includes a first matching transistor and a plurality of second matching transistors, an output terminal of the first matching transistor is grounded through a second feedback resistor, output terminals of the plurality of second matching transistors of each of the current matching circuits are connected to the second clock switch circuits of the plurality of second pulse control circuits respectively;
      a matching operational amplifier having an input terminal connected to the output terminal of the first matching transistor, and an output terminal connected to control terminals of the plurality of matching transistors; and
      a phase shifting circuit connected between the second voltage divider circuit and another input terminal of the matching operational amplifier.

7. The phase shift control circuit of claim 6, wherein the first clock switch circuit includes a first capacitor and a first clock switch which are connected to each other in parallel and grounded, wherein the first capacitor and the first clock switch are connected to the output terminal of the second transistor, and the input terminal of the first comparator connected to the output terminal of the second transistor is connected to a non-grounded terminal of the first capacitor; each of the second clock switch circuits includes a second capacitor and a second clock switch, one terminal of the second capacitor and one terminal of the second clock switch are connected to one of the second matching transistors of each of the current matching circuits, another terminal of the second capacitor and another terminal of the second clock switch are grounded, and one input terminal of the second comparator is connected to a non-grounded terminal of the second capacitor.

8. The phase shift control circuit of claim 6, wherein the first voltage divider circuit includes a first resistor and a second resistor which are connected to each other in series and grounded, the first resistor is connected to the input voltage source, and the input terminal of the front operational amplifier connected to the first voltage divider circuit is connected between the first resistor and the second resistor.

9. The phase shift control circuit of claim 6, wherein the second voltage divider circuit includes a third resistor and a forth resistor which are connected to each other in series and grounded, the third resistor is connected to the input voltage source and the phase shift circuit is connected between the third resistor and the fourth resistor.

10. The phase shift control circuit of claim 9, wherein the phase shift circuit includes a first phase shift resistor, a second shift resistor, a first phase shift capacitor and a second phase shift capacitor, one terminal of the first phase shift resistor is connected between the third resistor and the fourth resistor, and another terminal of the first phase shift resistor is grounded through the first phase shift capacitor, one terminal of the second phase shift resistor is connected between the first phase shift resistor and the first phase shift capacitor, and another terminal of the second phase shift resistor is grounded through the second phase shift capacitor, the another input terminal of the matching operational amplifier is connected between the second phase shift resistor and the second phase shift capacitor.

* * * * *